US012349290B2

(12) United States Patent
Vyskocil

(10) Patent No.: US 12,349,290 B2
(45) Date of Patent: Jul. 1, 2025

(54) PEDAL ASSEMBLY HAVING MULTI-LAYERS OF DIFFERENT TYPES OF OVERMOLD MATERIALS

(71) Applicant: KSR IP Holdings, LLC, Wilmington, DE (US)

(72) Inventor: Matthew Vyskocil, Ridgetown (CA)

(73) Assignee: KSR IP Holdings, LLC, Wilmington, DE (US)

( * ) Notice: Subject to any disclaimer, the term of this patent is extended or adjusted under 35 U.S.C. 154(b) by 367 days.

(21) Appl. No.: 17/948,553

(22) Filed: Sep. 20, 2022

(65) Prior Publication Data

US 2023/0086166 A1   Mar. 23, 2023

Related U.S. Application Data

(60) Provisional application No. 63/246,995, filed on Sep. 22, 2021.

(51) Int. Cl.
*H05K 5/00* (2006.01)
*B29C 45/14* (2006.01)
(Continued)

(52) U.S. Cl.
CPC ..... *H05K 5/0034* (2013.01); *B29C 45/14639* (2013.01); *H01R 13/50* (2013.01);
(Continued)

(58) Field of Classification Search
CPC ...... H05K 5/0034; H05K 3/284; H05K 3/285; H05K 2203/1322; H05K 2203/1327;
(Continued)

(56) References Cited

U.S. PATENT DOCUMENTS 7,025,638 B2 *   4/2006   Mott ................ B29C 45/14639
                                                            439/736
8,568,155 B2 *  10/2013   Sebald ................... H01R 24/28
                                                            439/304
(Continued)

FOREIGN PATENT DOCUMENTS

EP          0650315 A2    4/1995
WO       2020009925 A1    1/2020

OTHER PUBLICATIONS

International Search Report dated Jan. 12, 2023; International Application No. PCT/US2022/044094.

*Primary Examiner* — Harshad C Patel
(74) *Attorney, Agent, or Firm* — Dinsmore & Shohl LLP

(57) ABSTRACT

Embodiments herein are directed to an assembly that includes a circuit board, a plurality of terminal pins, a first material layer, a second material layer, and a third material layer. The plurality of terminal pins extend from the circuit board. The first material layer encases a portion of the circuit board. The second material layer encapsulates a portion of the plurality of terminal pins and encases the first material layer. The second material layer defines a connector interface. A material of the second material layer is different from a material of the first material layer. The third material layer encases the first material layer and at least a portion of the second material layer. The third material layer defines a housing that is formed from a material different then the material of the first material layer and different from the material of the second material.

20 Claims, 6 Drawing Sheets

(51) Int. Cl.
*H01R 13/50* (2006.01)
*H01R 43/24* (2006.01)
*H05K 3/28* (2006.01)
*B29K 77/00* (2006.01)

(52) U.S. Cl.
CPC .............. *H01R 43/24* (2013.01); *H05K 3/284* (2013.01); *B29K 2077/00* (2013.01)

(58) Field of Classification Search
CPC ...... H05K 2201/1034; B29C 45/14639; H01R 13/50; H01R 43/24; B29K 2063/00; B29K 2067/006; B29K 2077/00; B29L 2031/3425
See application file for complete search history.

(56) References Cited

U.S. PATENT DOCUMENTS

| | | | | |
|---|---|---|---|---|
| 8,966,975 | B2* | 3/2015 | Campbell | H05K 3/284 |
| | | | | 73/493 |
| 10,667,401 | B2* | 5/2020 | Heikkinen | H05K 1/189 |
| 11,088,066 | B2* | 8/2021 | Sääski | H01L 25/0657 |
| 2006/0110599 | A1* | 5/2006 | Honma | B32B 5/24 |
| | | | | 428/522 |
| 2008/0165511 | A1* | 7/2008 | Mayuzumi | H05K 5/0034 |
| | | | | 29/841 |
| 2011/0155414 | A1* | 6/2011 | Yasukawa | H02M 7/003 |
| | | | | 174/68.2 |
| 2015/0268261 | A1* | 9/2015 | Murray, Jr. | G01P 15/02 |
| | | | | 257/676 |
| 2017/0021725 | A1* | 1/2017 | Heipel | G01D 5/2046 |
| 2018/0072016 | A1* | 3/2018 | Samejima | B32B 27/06 |
| 2019/0234989 | A1* | 8/2019 | Na | G01D 11/24 |
| 2020/0229296 | A1* | 7/2020 | Keränen | H05K 1/181 |
| 2020/0266598 | A1* | 8/2020 | Ito | H01R 13/405 |
| 2020/0384704 | A1* | 12/2020 | Aratani | B29C 70/16 |
| 2021/0105904 | A1* | 4/2021 | Ali | H05K 5/03 |
| 2021/0144861 | A1* | 5/2021 | Spiegel | H05K 3/188 |

* cited by examiner

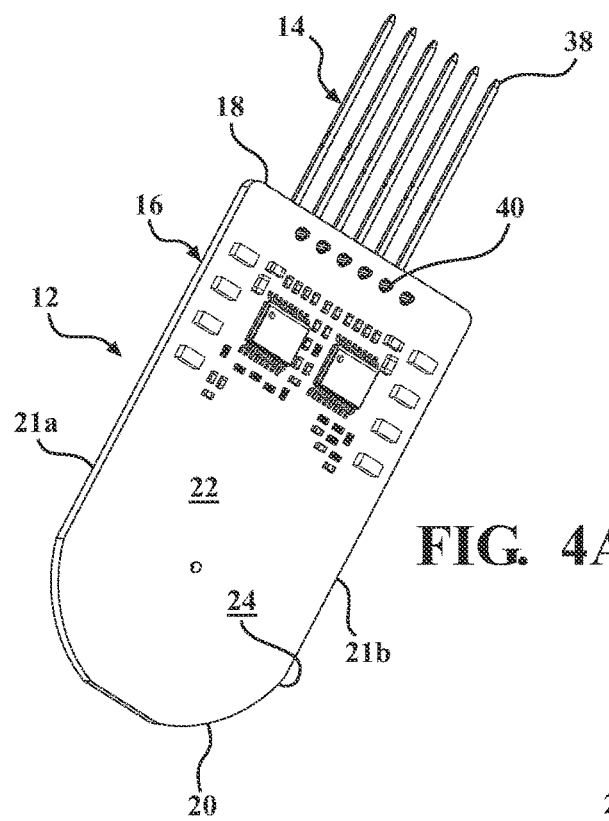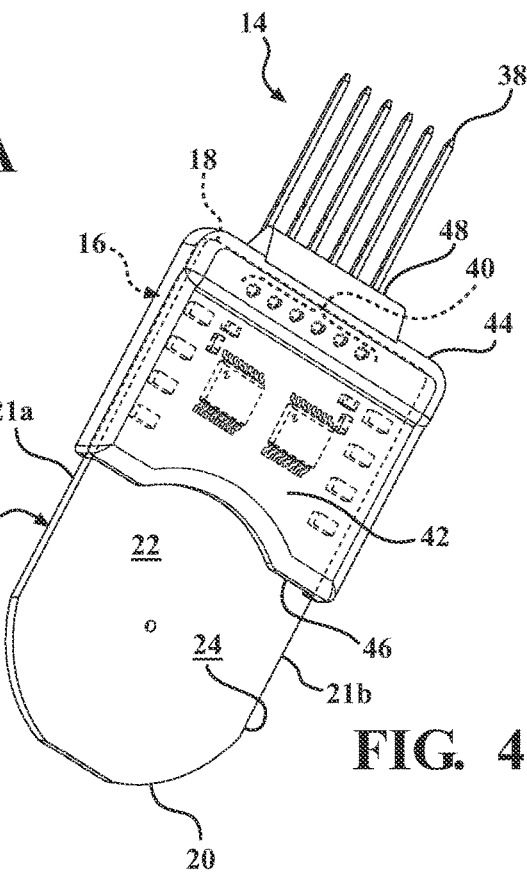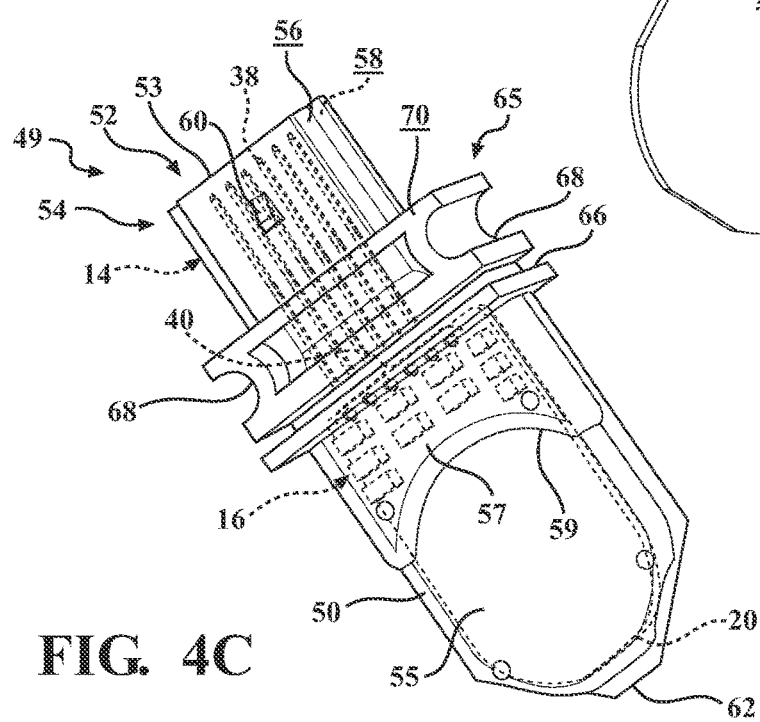
FIG. 4A
FIG. 4B
FIG. 4C

PEDAL ASSEMBLY HAVING MULTI-LAYERS OF DIFFERENT TYPES OF OVERMOLD MATERIALS

CROSS-REFERENCE TO RELATED APPLICATIONS

This utility patent application claims priority benefit from U.S. Provisional patent application Ser. No. 63/246,995, filed Sep. 22, 2021 and entitled "Connector Having Multi-Layers of Different Types of Overmold Materials", the entire contents of which is incorporated herein in its entirety.

TECHNICAL FIELD

The present specification generally relates to a connector assembly, and more specifically to a connector assembly with overmold materials.

BACKGROUND

Connectors are used in many applications to provide a direct link between a circuit board and a harness that ultimately transmits data between the circuit board and a controller. Protecting the connector and the circuit board has become increasing more important due to the positioning of the connectors and the circuit boards for environmental reasons, packaging reasons, and the like. As such, a need exists for an improved connector assemblies and circuit boards that are better protected.

SUMMARY

In one embodiment, a method of forming an assembly is provided. The method includes overmolding a portion of a circuit board having a plurality of electrical components with a first material, overmolding a plurality of terminal pins extending from the circuit board and the first material with a second material to form a connector interface, the second material different from the first material, and overmolding the first material and at least a portion of the second material with a third material, the third material is different from the first material and the second material.

In another embodiment, an assembly is provided. The assembly includes a circuit board, a plurality of terminal pins, a first material layer, a second material layer, and a third material layer. The circuit board has a plurality of electrical components. The plurality of terminal pins extend from the circuit board. The first material layer encases a portion of the circuit board. The second material layer encapsulates a portion of the plurality of terminal pins and encases the first material layer. The second material layer defines a connector interface. A material of the second material layer different from a material of the first material layer. The third material layer encases the first material layer and at least a portion of the second material layer. The third material layer defines a housing formed from a material different then the material of the first material layer and different from the material of the second material.

In another embodiment, a pedal assembly is provided. The pedal assembly includes a circuit board, a plurality of terminal pins, a first material layer, a second material layer, and a third material layer. The circuit board includes a first end, an opposite second end, and a surface extending between the first end and the second end. A plurality of electrical components are coupled to the surface adjacent to the first end. The plurality of terminal pins extend from the first end of the circuit board. The first material layer encases the first end, the plurality of electrical components, and a portion of the plurality of terminal pins. The second material layer encapsulates a portion of the plurality of terminal pins and encases the first material layer and the circuit board. The second material layer defines a connector interface. A material of the second material layer is different from a material of the first material layer. A third material layer defines a housing to encapsulate the first material layer and at least a portion of the second material layer. The third material layer is formed of a material different from the material of the second material layer and from the material of the first material layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 4A schematically depicts an isolated view of a circuit board and a plurality of terminal pins of the connector assembly of FIG. 1 according to one or more embodiments shown and described herein;

FIG. 4B schematically depicts an isolated view of a first overmold layer of the connector assembly of FIG. 1 according to one or more embodiments shown and described herein;

FIG. 4C schematically depicts an isolated view of a second overmold layer of the connector assembly of FIG. 1 according to one or more embodiments shown and described herein;

DETAILED DESCRIPTION

Figure 1:
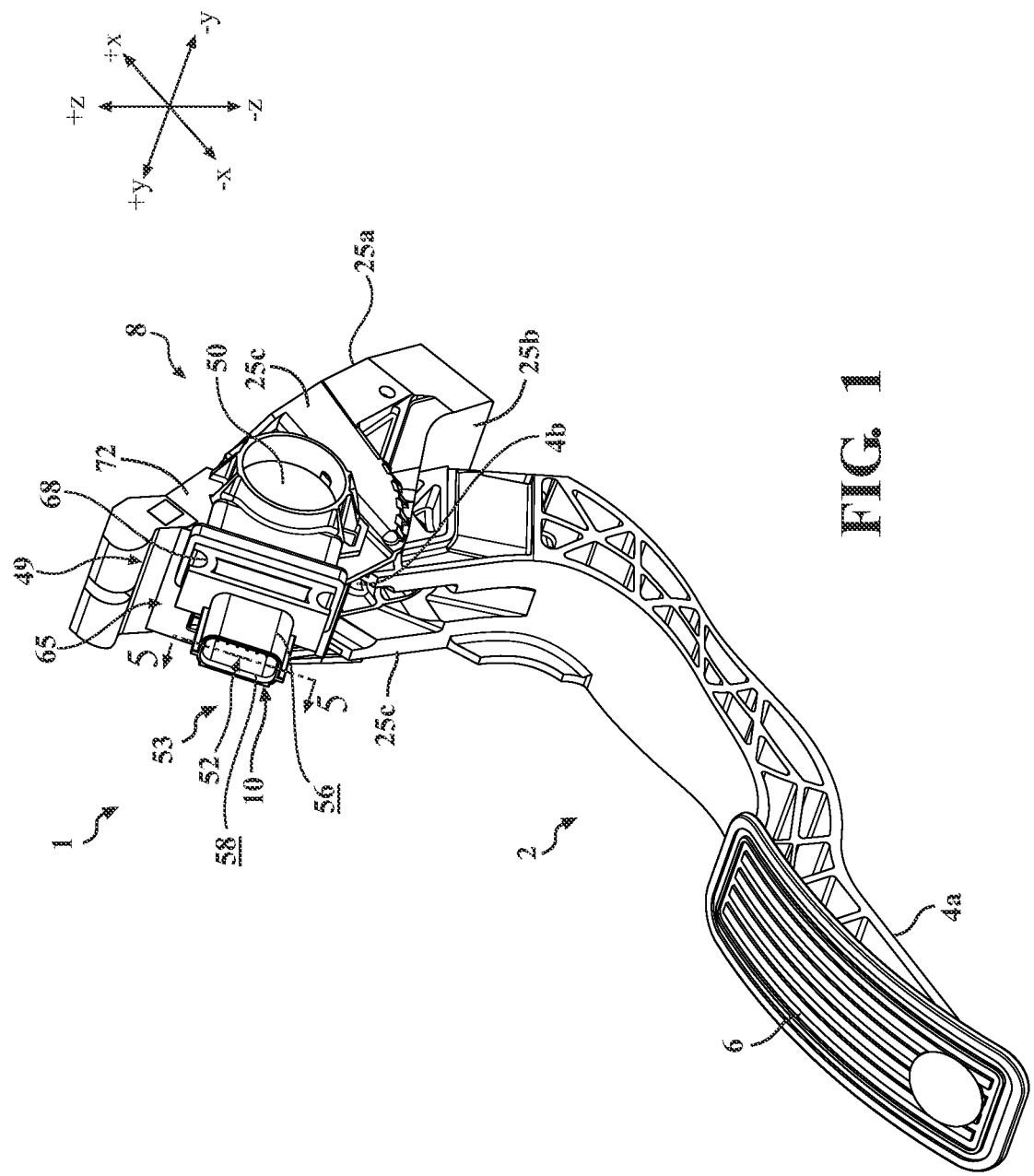
FIG. 1 schematically depicts a perspective view of a pedal assembly that includes a connector assembly according to one or more embodiments shown and described herein.

Connectors are used in many applications to provide a direct link between a circuit board on a component and a harness separate from the component that ultimately transmits data between the circuit board and a controller. Conventional assemblies rely solely on a housing in which the circuit board is housed or embedded within to protect the circuit board. However, the housing cavities that receive the circuitry board do not independently protect the circuit board or the electrical components thereof.

Embodiments described herein are directed to a pedal assembly that includes a connector assembly formed from multiple layers of different types of overmold. The connector assembly includes a circuit board with a plurality of electrical components and a plurality of terminal pins extending therefrom. A first material layer of a low-pressure epoxy overmold is positioned to encase at least a portion of the circuit board, the plurality of electrical components and at least a portion of the plurality of terminal pins. As such, the first material layer seals and protects the various components of the circuit board. A second material layer of a polybutylene terephthalate (PBT), or other like material, covers or encases the first material layer and the circuit board and encloses or encapsulates portions of the plurality of terminal pins, thereby forming a connector interface that communicatively couples the connector assembly to a vehicle side connector.

A third material layer of a high pressure mold defines a housing to encapsulate the circuit board, the first material layer and portions of the second material layer to releasably couple the connector assembly to the housing. The third material layer interlocks and seals the circuit board inside the housing to create protection for the circuit board and the electrical components thereof. The assembly creates an improved connector assembly over conventional assemblies as the circuit board is positioned inside the housing wall and the electrical components are encased by the first material layer and the second material layer ensuring that the circuit board is better protected, that there is not leak path between the housing and connector, is customizable, and easier to manufacture at reduced costs compared to conventional assemblies.

Various embodiments of the connector assembly and methods for assembly are described in detail herein.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the assembly in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

As used herein, the term "communicatively couple" means that coupled components are capable of exchanging data signals and/or electric signals with one another such as, for example, electrical signals via conductive medium, electromagnetic signals via air, optical signals via optical waveguides electrical energy via conductive medium or a non-conductive medium, data signals wirelessly and/or via conductive medium or a non-conductive medium and the like.

As used herein, the term "encase" means to enclose or cover with a direct contact and the term "encapsulate" means to surround without a direct contact.

Further, as used herein, the term "longitudinal direction" refers to the forward-rearward direction of the pedal assembly (i.e., in the +/−X-direction depicted in the coordinate axes of FIGS. 1-3 and 5). The term "lateral direction" refers to the cross-electrical device direction (i.e., in the +/−Y-direction depicted in the coordinate axes of FIGS. 1-3 and 5), and is transverse to the longitudinal direction. The term "vertical direction" or "below" or "above" refer to the upward-downward direction of the electrical device (i.e., in the +/−vehicle Z-direction depicted in the coordinate axes of FIGS. 1-3 and 5).

Referring now to FIG. 1, an example pedal assembly 1 is provided. The example pedal assembly 1 may be an electronic throttle control pedal assembly or other accelerator pedal assembly, a brake pedal assembly, a clutch pedal assembly, and/or the like. Further, the example pedal assembly 1 may be a hanging type pedal assembly that may be mounted to an instrument panel, a firewall, a bracket or otherwise suspended above a floor of a vehicle. The example pedal assembly 1 may generally include a pedal arm 2. The pedal arm 2 includes a distal end 4a and an opposite proximal end 4b. The distal end 4a may include a pedal pad 6. The proximal end 4b may be received by a housing 8. The example pedal assembly 1 further includes an example connector assembly 10. Portions of the example connector assembly 10 are received by the housing 8, as discussed in greater detail herein.

Figure 2:
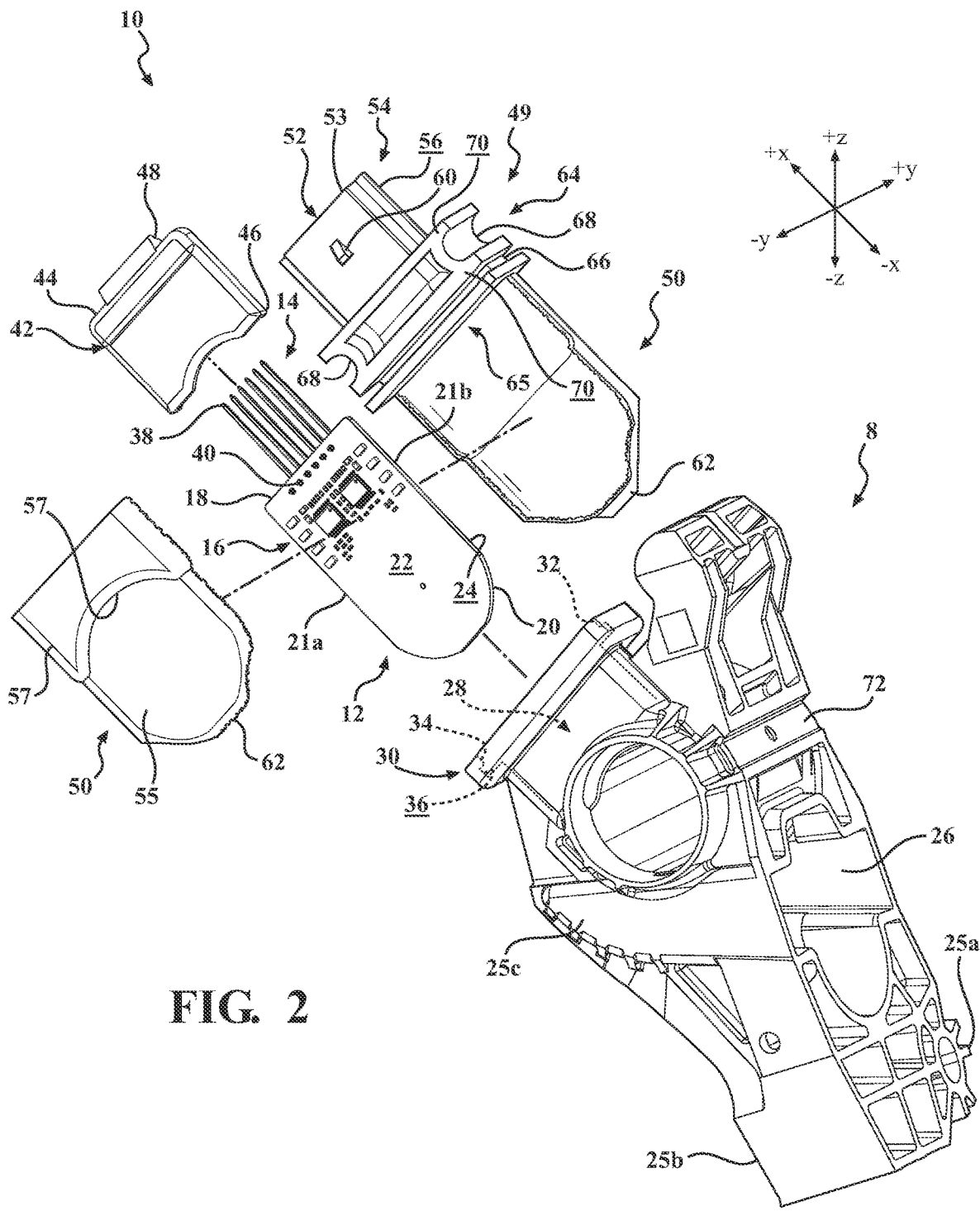
FIG. 2 schematically depicts a partial exploded perspective view of the pedal assembly of FIG. 1 according to one or more embodiments shown and described herein.
Figure 3:
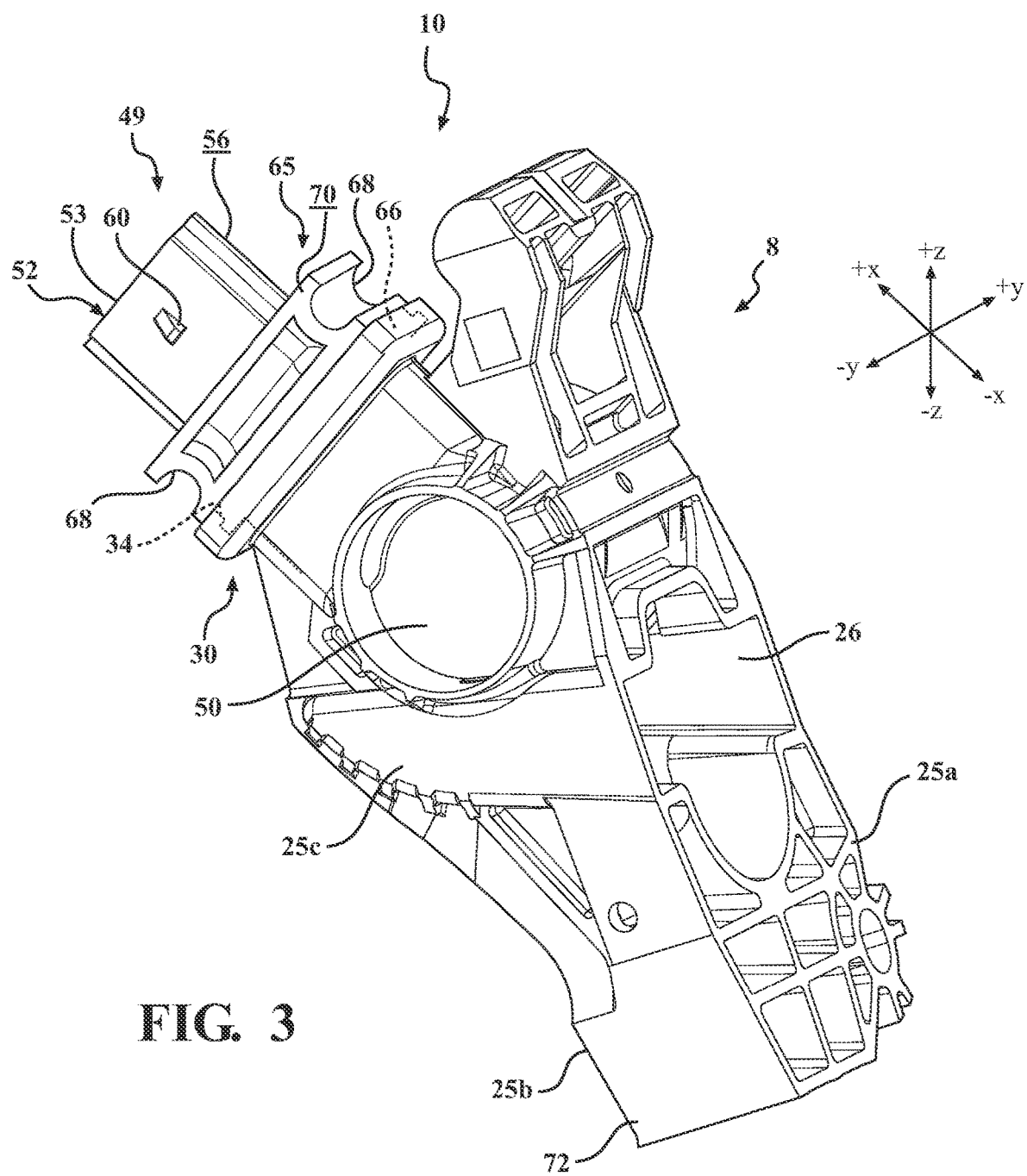
FIG. 3 schematically depicts a partial isolated view of the pedal assembly of FIG. 2 illustrating a connection recess according to one or more embodiments shown and described herein.

Still referring to FIG. 1 and now referring to FIGS. 2-3, the housing 8 is formed to include an end wall 25a and an opposite front wall 25b and a pair of sidewalls 25c. The housing 8 may also include a pedal receiving aperture 26 that is positioned between the pair of sidewalls 25c and extends between the end wall 25a and the front wall 25b. The pedal receiving aperture 26 may receive the proximal end 4b of the pedal arm 2. Further, other components of the pedal assembly 1, such as a spring carrier, may be positioned within the pedal receiving aperture 26. As such the pedal arm 2 may move or pivot within the aperture, within included guides for such movement formed into the various walls (e.g., the inner surfaces of the pair of sidewalls 25c) dependent on the amount of pressure of force applied onto the pedal pad 6 by a user.

Figure 5:
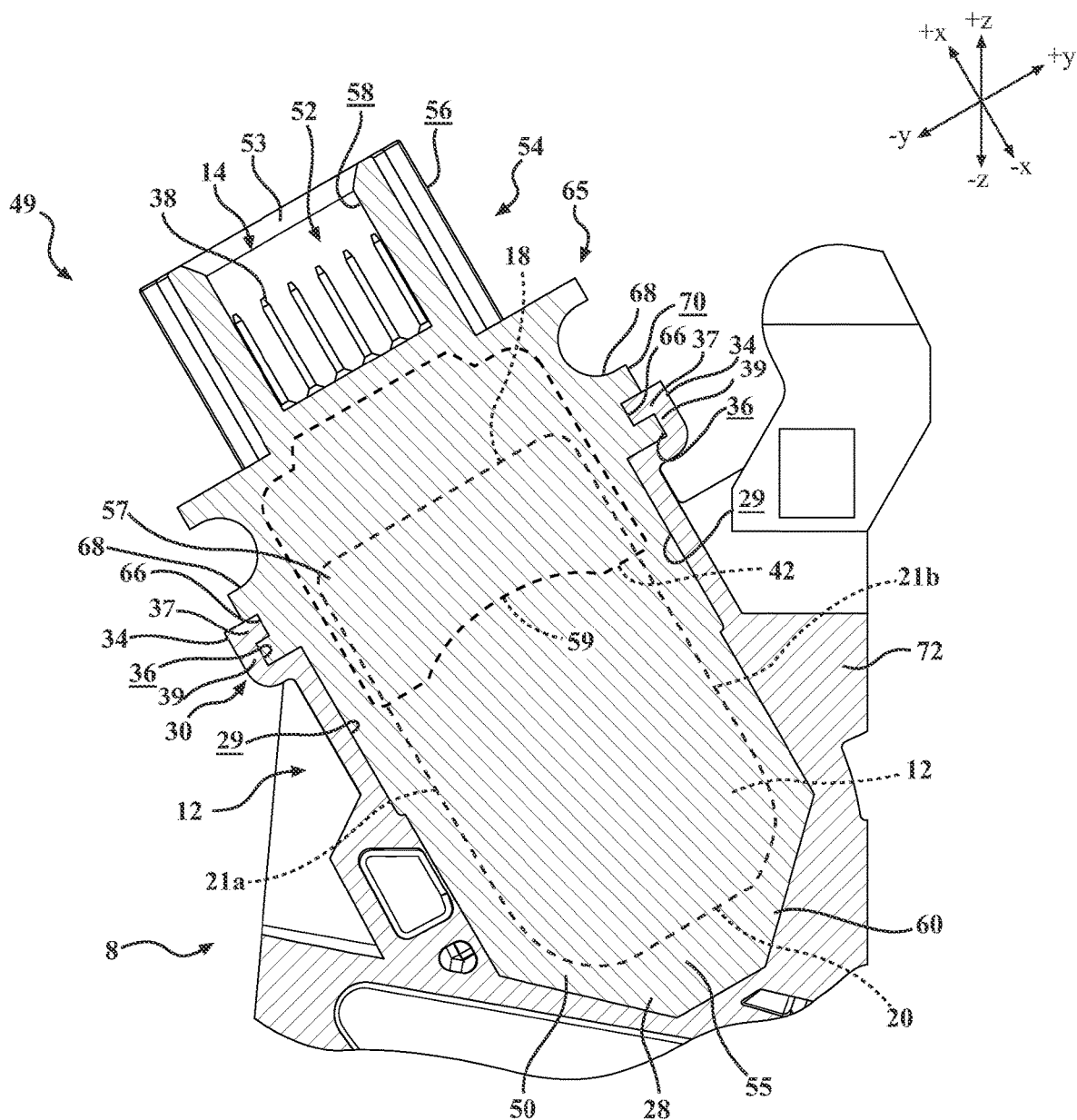
FIG. 5 schematically depicts a partial cross sectional view of the pedal assembly of FIG. 1 according to one or more embodiments shown and described herein.

In some embodiments, the housing 8 is formed to include a void 28 that receives at least a portion of the connector assembly 10, as discussed in greater detail herein. The void 28 may include an inner surface 29. Further, the housing 8 may include a flange portion 30 that circumferentially surrounds an opening 32, which permits access to the void 28 and the inner surface 29, as best illustrated in FIG. 5. A lip 34 extends from an inner surface 29 of the flange portion 30 and extends around the inner perimeter of the flange portion 30. The lip 34 includes a protrusion portion 37 and a recess portion 39. The recess portion 39 includes an inner surface 36. The lip 34 receives portions of the example connector assembly 10 to retain the example connector assembly 10 within the housing 8, as discussed in greater detail herein.

Still referring to FIGS. 1-3 and now referring to FIGS. 4A-4C, the example connector assembly 10 includes a circuit board 12, a plurality of terminal pins 14 extending therefrom, and a plurality of electrical components 16 positioned thereon. That is, the circuit board 12 includes a first end 18, an opposite second end 20, a pair of edges 21a, 21b extending between the first end 18 and the second end 20, and includes an exterior surface 22 and an opposite interior surface 24. The exterior surface 22 and the interior surface 24 extend between the first end 18 and the second end 20 and between the pair of edges 21a, 21b. The circuit board 12 may be a printed circuit board, a flexible circuit board, or other kind of circuit boards known to those in the art.

The second end 20 of the circuit board 12 may generally be a curvilinear shape whereas the first end 18 may be linear in shape. The plurality of terminal pins 14 may be communicatively coupled or otherwise attached to the first end 18 and extend outwardly from the first end 18. Each terminal pin of the plurality of terminal pins 14 has a terminating end 38 and a coupled end 40. The coupled end 40 may be communicatively coupled to the first end 18 of the circuit board 12. In some embodiments, the plurality of terminal pins 14 may be spring loaded.

In some embodiments, the plurality of electrical components 16 may extend from the exterior surface 22 near or adjacent to, or closer to, the first end 18 than compared to the second end 20. In other embodiments, the plurality of electrical components 16 may extend from the interior surface 24 and/or some may extend from the interior surface 24 while others extends from the exterior surface 22. As such, the plurality of electrical components 16 may extend between and through the exterior surface 22 and the interior surface 24 of the circuit board 12. The plurality of electrical components 16 may include components such as semiconductors, application-specific integrated circuit, resistors, transistors, capacitors, inductors and the like.

A first material layer 42 may coat and/or encase the first end 18 of the circuit board 12 along with portions of the exterior surface 22 and the interior surface 24 of the circuit board 12, the plurality of electrical components 16 and the coupled end 40 of the plurality of terminal pins 14. The first material layer 42 may include a first terminating portion 44 and an opposite second terminating portion 46. The second terminating portion 46 terminates before encasing the second end 20 of the circuit board 12. In some embodiments, the second terminating portion 46 is curvilinear in shape. In other embodiments, the first terminating portion 44 is linear or other shapes.

In some embodiments, a rib 48 may extend from the first terminating portion 44 may be perforated to allow portions of each one of the plurality of terminal pins 14 to extend therethrough. In some embodiments, the rib 48 maybe triangular in shape. In other embodiments, the rib 48 maybe rectangular, circular, and/or the like. As such, the first material layer 42 encases other portions of the plurality of terminal pins 14 other than the coupled end 40.

It should be understood that the first material layer 42 may seal and protect the plurality of electrical components 16 and portions of the plurality of terminal pins 14 and the circuit board 12 that are beneath, coated by, or encases by the first material layer 42.

The first material layer 42 may be an overmold material such as a low-pressure epoxy overmold. For example, a material of the first material layer 42 may be various materials such as acrylonitrile butadiene styrene (ABS), polyethylene, polypropylene, polycarbonate, polyamide thermoplastic—known as nylon—and variations of nylon including PA6 and PA66, polyphthalamide, polycarbonate/acrylonitrile butadiene styrene, polyurethane polymethyl methacrylate, high density polyethylene, low density polyethylene, polystyrene, polyether ether ketone, polyoxymethylene (Acetal/Delrin), polyethylene terephthalate, thermoplastic elastomer, polyetherimide, theremoplastic vulcanizate, polysulfone, and/or the like, and combinations thereof. Additionally, additive may be added such as ultra-violet (UV) absorbers, flame-retardants, colorants, glass fibers, plasticizers, carbon fiber, aramid fiber, glass bead, PTFE, PFPE, TALC, Molybdenum Disulfide, graphite, and/or the like.

In some embodiments, the first material layer 42 may be formed through injection molding. The overmold may be one continuous piece of construction, but it is to be understood that the overmold may have different constructions. In some embodiments, the overmold may be coupled or bonded together using any suitable method or manufacture such as snap fit, friction fit, press fit, and mechanical clamping.

Still referring to FIGS. 1-3 and 4A-4C and now referring to FIG. 5, a second material layer 50 may be used to form and/or define a connector interface portion 49. The second material layer 50 circumferentially coats and/or encases the first material layer 42 along with the second end 20 of the circuit board 12. That is, the second material layer 50 encases or covers the first material layer 42, covers the circuit board 12 including both the first end 18 and the second end 20 and the exterior and interior surfaces 22, 24 of the circuit board 12, the plurality of electrical components 16 and the coupled end 40 of the plurality of terminal pins 14. As such, it should be understood that the exploded view in FIG. 2 merely illustrates the second material layer 50 as two halves or separated for ease of illustrating the first material layer 42 and the circuit board 12 are encased by the second material layer 50. As such, the second material layer 50 may be a continuous coating to encase the first material layer 42 and the circuit board 12.

The second material layer 50 may coat on or over the circuit board 12 and the first material layer 42 to form a thicker overmold layer 57 and a recessed thinner layer 55 separated by a ridge 59. The ridge 59 may be curvilinear or arcuate in shape. The thicker overmold layer 57 of the second material layer 50 extends from the first material layer 42 in the lateral direction (i.e., the Y direction as shown in FIG. 2) over the plurality of electrical components 16. The recessed thinner layer 55 encases or coats the second end 20 of the circuit board 12, which creates the recessed thinner layer 55 between the second terminating portion 46 of the first material layer 42 and the second end 20 of the circuit board 12, which does not include the first material layer 42 and/or the plurality of electrical components 16. That is, the second material layer 50 may be the thicker overmold layer 57 at the first end 18 of the circuit board 12 and the recessed thinner layer 55 is at the second end 20 of the circuit board 12.

Additionally, the connector interface portion 49 is molded such that the second material layer 50 forms a cavity 52 that has an opening 53 and encapsulates the terminating end 38 of the plurality of terminal pins 14 without enclosing the plurality of terminal pins 14 such that a vehicle side connector may have access to at least the terminating end 38 of the plurality of terminal pins 14 via the opening 53. That is, the cavity 52 circumferentially surrounds the plurality of terminal pins 14 without encasing the terminating end 38 of the plurality of terminal pins 14 such that access is provided to the plurality of terminal pins 14 via the opening 53. As such, the second material layer 50 forms and/or defines an interface portion 54 of the connector interface portion 49 that includes an outer surface 56 and an opposite inner surface 58 that is spaced apart from the plurality of terminal pins 14 to form and/or define the cavity 52 and the opening 53.

A protrusion 60 extends from the outer surface 56 of the interface portion 54. The protrusion 60 may receive a receiving aperture of a vehicle-side connector assembly to releasably lock, couple, and/or engage the vehicle-side connector assembly to the interface portion 54 via the protrusion 60. As such, while the protrusion 60 is generally illustrated as a triangular shape, this is non-limiting and the protrusion 60 may be any shape including square, circular, rectangular, hexagonal, and/or the like. Further, the interface portion 54 may include various mating features such as apertures, indentions, protrusions, recesses, and the like, to provide proper alignment and a secured coupling between the interface portion 54 formed and/or defined by the second material layer 50 and the vehicle side connector or interface.

Opposite of the interface portion 54 may be an end portion 62 that may take on the shape of the second end 20 of the circuit board 12 in which it is encasing or coating. As such the second material layer 50 extends to cover or encase the second end 20 of the circuit board 12 and extends to coat or encase the edges 21a, 21b of the circuit board 12 in the lateral direction (i.e., in the +/−Y direction). The second material layer 50 also extends to encapsulate the plurality of terminal pins 14 by extending beyond the terminating end 38 of the plurality of terminal pins 14 in the vertical direction (i.e., in the +/−Z direction).

An interlock portion 64 is formed in the second material layer 50 to interlock the connector interface portion 49 with the housing 8, as discussed in greater detail herein. The interlock portion 64 may include a projection portion 65 that includes a receiving groove 66 and a pair of indentions 68. The pair of indentions 68 may be rounded, such as semicircular, with a smooth contour, as illustrated. This is non-limiting and the pair of indentions 68 may be any shape including rectangular, octagonal, square, and the like. The receiving groove 66 may circumferentially extend around an outer surface 70 of the projection portion 65 and is positioned below the pair of indentions 68 in the vertical direction (i.e., in the +/−Z direction).

In an assembled state, as best illustrated in FIG. 5, the receiving groove 66 receives the protrusion portion 37 of the lip 34. Further, the recess portion 39 of the lip 34 may receive a portion of the outer surface 70 of the projection portion 65 such that the outer surface 70 abuts the inner surface 36 of the flange portion 30 to interlock the connector interface portion 49 to the housing 8. In some embodiments, the portion of the outer surface 70 of the projection portion 65 received within the recess portion 39 of the lip 34 is positioned below the receiving groove 66 in the vertical direction (i.e., in the +/−Z direction).

It should be understood that many different structures such as latches, protrusion, and openings may be used to couple the connector interface portion 49 of the connector assembly 10 to the housing 8. In some embodiments, the connector interface portion 49 may be removably coupled to the housing 8 to allow for disassembling and reassembly of the connector assembly 10. As such, the pair of indentions 68 may be used to provide a handhold for grip on the connector interface portion 49 to remove or insert the connector assembly 10 to/from the housing 8. As discussed in greater detail herein, the connector assembly 10 may be releasably coupled to the housing 8 via a snap fit, friction fit, press fit or the like.

In some embodiments, the second material layer 50 is a high-pressure mold and is formed of a Polybutylene Terephthalate material. In other embodiments, the second material layer 50 of may be formed with various materials such as acrylonitrile butadiene styrene, polyethylene, polypropylene, polycarbonate, polyamide thermoplastic—known as nylon—and variations of nylon including PA6 and PA66, Polyphthalamide, polycarbonate/acrylonitrile butadiene styrene, polyurethane polymethyl methacrylate, high density polyethylene, low density polyethylene, polystyrene, polyether ether ketone, polyoxymethylene(Acetal/Delrin), polyethylene terephthalate, thermoplastic elastomer, polyetherimide, theremoplastic vulcanizate, polysulfone, and/or the like, and combinations thereof. Additionally, additive may be added such as ultraviolet (UV) absorbers, flame-retardants, colorants, glass fibers, plasticizers, carbon fiber, aramid fiber, glass bead, PTFE, PFPE, TALC, Molybdenum Disulfide, graphite, and/or the like. As such, the material of the second material layer 50 is different from the material of the first material layer 42 and may be formed using different injection techniques due to the second material layer 50 using high-pressure mold.

That is, in some embodiments, the second material layer 50 may form and/or define the connector assembly 10 through injection molding. The overmold may be one continuous piece of construction, but it is to be understood that the overmold may have different constructions. In some embodiment the overmold may be coupled or bonded together using any suitable method or manufacture such as snap fit, friction fit, press fit, and mechanical clamping.

Still referring to FIGS. 1-5, the housing 8 may be formed and/or defined by a third material layer 72. The third material layer 72 circumferentially covers to encapsulate all of the first material layer 42, the circuit board 12, and portions of the second material layer 50 (i.e., the connector interface portion 49). The third material layer 72 is a different material then the first material layer 42 and a different material then the second material layer 50. As such, the first material layer 42, the second material layer 50, and the third material layer 72 are each different from one another and form and/or define different components of the example pedal assembly 1, as discussed in greater detail herein.

The third material layer 72 defines the housing 8, which also forms part of the interlock to couple the connector assembly 10 to the housing 8, as discussed in greater detail herein. As such, the connector interface portion 49 is received within the housing 8 to releasably couple the connector assembly 10 to the housing 8 such that the circuit board 12 is received within the void 28 to seal and protect the circuit board 12 and the plurality of electrical components 16. In some embodiments, the connector assembly 10, which includes the circuit board 12, the first material layer 42 and second material layer 50 may be removable from the third material layer 72 that forms the housing 8. That is, the receiving groove 66 receives the lip 34 of the housing 8 and provides enough coupling strength to retain or interlock the connector assembly 10 within the void 28 of the housing 8, but also allows for the connector assembly 10 to be removed from the housing 8 and the same connector assembly 10 or another connector assembly to be reinserted into the void 28 of the housing 8.

In some embodiments, the third material layer 72 of overmold is a polyamide thermoplastic. In other embodiments, the third material layer 72 may be formed with various materials such as acrylonitrile butadiene styrene, polyethylene, polypropylene, polycarbonate, and variations of nylon including PA6 and PA66, Polyphthalamide, polycarbonate/acrylonitrile butadiene styrene, polyurethane polymethyl methacrylate, high density polyethylene, low density polyethylene, polystyrene, polyether ether ketone, polyoxymethylene(Acetal/Delrin), polyethylene terephthalate, thermoplastic elastomer, polyetherimide, theremoplastic vulcanizate, polysulfone, and/or the like, and combinations thereof. Additionally, additive may be added such as ultraviolet (UV) absorbers, flame-retardants, colorants, glass fibers, plasticizers, carbon fiber, aramid fiber, glass bead, PTFE, PFPE, TALC, Molybdenum Disulfide, graphite, and/or the like.

In some embodiments, the third material layer 72 may form and/or define the housing 8 through injection molding. The overmold may be one continuous piece of construction, but it is to be understood that the overmold may have different constructions. In some embodiment the overmold may be coupled or bonded together using any suitable method or manufacture such as snap fit, friction fit, press fit, and mechanical clamping.

It should be understood that each material layer (e.g., the first material layer 42, the second material layer 50, and the third material layer 72) may be formed and/or defined with a different shape, from a different type of material, formed differently (e.g., low pressure, high pressure, and/or the like) and serve a different purpose. Further, only portions of each layer may overlap. For example, only a portion of the second material layer 50 that forms and/or defines the connector interface portion 49 is encapsulated or covered by the third material layer 72 that forms and/or defines the housing 8. Further, only a portion of the circuit board 12 is enclosed by the first material layer 42. The second material layer 50 encases the first material layer 42 and the circuit board 12, but only encapsulates a portion of the plurality of terminal pins 14. The cavity 52 is provided for portions of the plurality of terminal pins 14 to extend within and that allows for access to the plurality of terminal pins 14 via a vehicle side connector to communicatively couple the circuit board 12 to a vehicle side controller, such as an electronic control unit with a processing device. As such, certain data gathered and/or provided to/by the circuit board 12 and the plurality of electrical components 16 positioned thereon may be communicated through the plurality of terminal pins 14 to the electronic control unit of the vehicle. For example, the certain data gathered and/or provided to/by the circuit board 12 and the plurality of electrical components 16 may be data related to movement of the pedal arm 2 and/or a coupler or target that moves either linearly or angularly indicative of movement of the pedal arm 2, which is dependent on a pressure or force applied to the pedal pad 6 by the user.

Figure 6:
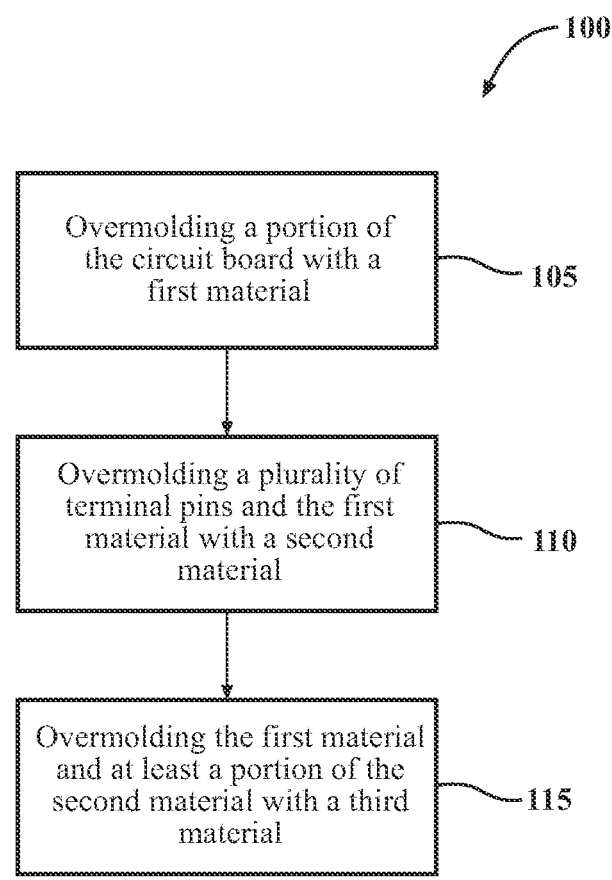
FIG. 6 schematically depicts an illustrative flowchart for a method of forming a connector assembly according to one or more embodiments shown and described herein.

Still referring to FIGS. 1-5 and now referring now to FIG. 6, which is a flow diagram that graphically depicts an illustrative method 100 for forming the example pedal assembly 1. Although the steps associated with the blocks of FIG. 6 will be described as being separate tasks, in other embodiments, the blocks may be combined or omitted. Further, while the steps associated with the blocks of FIG. 6 will described as being performed in a particular order, in other embodiments, the steps may be performed in a different order.

At block 105, a portion of the circuit board 12 that includes the plurality of electrical components 16 is overmolded with the first material layer 42 to encase the portion of the circuit board 12 that includes the plurality of electrical components 16. The first material layer 42 may be a low-pressure epoxy. In some embodiments, the first material layer 42 may circumferentially encase part of the plurality of terminal pins 14. For example, the first material layer 42 may encase the plurality of terminal pins 14 anywhere between the coupled end 40 and the terminating end 38.

At block 110, the first material layer 42, the circuit board 12, and a portion of the plurality of terminal pins 14 that extend outwardly from the first end 18 of the circuit board 12 are overmolded with the second material layer 50 to encase each of the first material layer 42, the circuit board 12, and the portion of the plurality of terminal pins 14. That is, the second material layer 50 may encase the entirety of the circuit board 12 and the first material layer 42 and encapsulates the plurality of terminal pins 14 within the cavity 52. The second material layer 50 forms and/or defines the connector interface portion 49 of the connector assembly 10 and forms the interlock portion 64 to removably couple the connector assembly 10 to the housing 8. The protrusion 60 retains a vehicle side connector to the connector assembly 10. The second material layer 50 is different from the first material layer 42. The second material layer 50 may be a high-pressure mold.

At block 115, the first material layer 42 and at least a portion of the second material layer 50 is overmolded with a third material layer 72 that defines a housing 8 to encapsulate the first material layer 42 and at least a portion of the second material layer 50. The first material layer 42 is encapsulated with the void 28 of the housing 8 such that the circuit board 12, the first material layer 42, and portions of the second material layer 50 are received within the void 28. The third material layer 72 is different from the first material layer 42 and the second material layer 50.

The above-described example pedal assembly provides a connector assembly that includes multi-layers of different types of overmold materials. A circuit board of the connector assembly is partially coated or encased with a first layer of a low-pressure epoxy overmold. A second layer of a PBT pressure mold is positioned to circumferentially cover portions of the first layer, the circuit board, and from the interface. A third layer of a high pressure mold circumferentially covers the entire first layer the circuit board, and portions of the second layer to form and/or define a housing and such that the connector assembly may be releasably interlocked or coupled to the housing.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of forming an assembly comprising:
   overmolding a portion of a circuit board having a plurality of electrical components with a first material to form a first layer formed of the first material;
   forming a connector assembly portion by overmolding a portion of a plurality of terminal pins extending from the circuit board, the circuit board, and the first layer with a second material to form a second layer formed of the second material, the second material is formed of a material different from a material of the first material; and
   forming a housing by overmolding the first layer and at least a portion of the second layer with a third material to form a third layer formed of the third material, a material of the third material is different from the material of the first material layer and the material of the second material.

2. The method of claim 1, wherein the housing is configured to encapsulate the circuit board and at least a portion of the plurality of terminal pins.

3. The method of claim 2, wherein the overmolding with the third material layer interlocks with the second material to seal the circuit board within a void of the housing.

4. The method of claim 1, wherein the material of the first material is a low pressure epoxy.

5. The method of claim 1, wherein the material of the second material is a high pressure overmold formed of Polybutylene Terephthalate.

6. The method of claim 1, wherein the material of the third material is a polyamide thermoplastic.

7. The method of claim 1, wherein the second material layer encapsulates all of the circuit board.

8. The method of claim 1, wherein the connector interface portion is formed to define a receiving cavity to provide access to the plurality of terminal pins extending from the circuit board.

9. An assembly comprising:
a circuit board having a plurality of electrical components;
a plurality of terminal pins extending from the circuit board;
a first material to form a first layer formed of the first material encases a portion of the circuit board;
a second material to form a second layer formed of the second material encapsulates the plurality of terminal pins and encases the first layer and the circuit board, the second material being shaped to define a connector interface, a material of the second material different from a material of the first material; and
a third material to form a third layer formed of the third material being shaped to define a housing that encapsulates the first layer and at least a portion of the second layer, the third material is formed of a material different from the material of the second material and from the material of the first material-layer.

10. The assembly of claim 9, wherein a void formed in the housing receives the circuit board and at least a portion of the plurality of terminal pins.

11. The assembly of claim 10, wherein the housing includes a lip within the void of the housing, the lip is received by a groove formed in the connector interface to interlock the connector interface to the housing and to seal the circuit board within the void formed in the housing.

12. The assembly of claim 10, wherein the material of the first material is a low pressure epoxy.

13. The assembly of claim 10, wherein the material of the second material is a high pressure overmold formed of Polybutylene Terephthalate.

14. The assembly of claim 10, wherein the material of the third material is a polyamide thermoplastic.

15. The assembly of claim 10, wherein the second material layer encases the entire circuit board.

16. The assembly of claim 10, wherein the connector interface is formed to include a cavity to provide access to the plurality of terminal pins extending from the circuit board.

17. A pedal assembly having a housing, the pedal assembly comprising:
a circuit board including:
a first end, an opposite second end, and a surface extending between the first end and the second end, and
a plurality of electrical components coupled to the surface adjacent to the first end; a plurality of terminal pins extending from the first end of the circuit board; and
a first material to form a first layer formed of the first material encases the first end, the plurality of electrical components, and a portion of the plurality of terminal pins;
a second material to form a second layer further formed of the second material being shaped to define a connector interface, the connector interface encapsulates a portion of the plurality of terminal pins and encases the first layer and the circuit board, a material of the second material layer different from a material of the first material; and
a third material to form a third layer formed of the third material being shaped to define the housing to encapsulate the first layer and at least a portion of
the second layer, the third material is formed from of a material different from the material of the second material and from the material of the first material.

18. The pedal assembly of claim 17, wherein the housing includes a lip within a void of the housing, the lip is received by a groove formed in the connector interface to interlock the connector interface to the housing and to seal the circuit board within the void of the housing.

19. The pedal assembly of claim 17, wherein:
the material of the first material is a low pressure epoxy;
the material of the second material is a high pressure mold; and
the material of the third material is a polyamide thermoplastic.

20. The pedal assembly of claim 19, wherein the second material is a Polybutylene Terephthalate.

* * * * *